(12) United States Patent
Natsumeda et al.

(10) Patent No.: US 9,041,041 B2
(45) Date of Patent: May 26, 2015

(54) OPTICAL DEVICE, OPTICAL ELEMENT, AND IMAGE DISPLAY DEVICE

(71) Applicant: NEC Corporation, Tokyo (JP)

(72) Inventors: Masanao Natsumeda, Tokyo (JP); Masao Imai, Tokyo (JP); Shin Tominaga, Tokyo (JP); Naofumi Suzuki, Tokyo (JP); Mizuho Tomiyama, Tokyo (JP); Yuji Ohno, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/370,886

(22) PCT Filed: Oct. 3, 2012

(86) PCT No.: PCT/JP2012/075695
§ 371 (c)(1),
(2) Date: Jul. 7, 2014

(87) PCT Pub. No.: WO2013/103037
PCT Pub. Date: Jul. 11, 2013

(65) Prior Publication Data
US 2015/0016085 A1    Jan. 15, 2015

(30) Foreign Application Priority Data
Jan. 7, 2012    (JP) ................. 2012-001692

(51) Int. Cl.
*H01L 21/00* (2006.01)
*G02B 5/00* (2006.01)
*G03B 21/20* (2006.01)
(Continued)

(52) U.S. Cl.
CPC . *G02B 5/008* (2013.01); *G02B 5/30* (2013.01); *H01L 33/0004* (2013.01); *G03B 21/2073* (2013.01); *G03B 21/2006* (2013.01);
(Continued)

(58) Field of Classification Search
CPC ...... G02B 5/008; G02B 5/30; G03B 21/2073; G03B 21/2006
See application file for complete search history.

(56) References Cited

U.S. PATENT DOCUMENTS

2007/0181889 A1    8/2007    Orita
2012/0314188 A1*   12/2012   Tominaga et al. ............... 353/20

FOREIGN PATENT DOCUMENTS

JP    2007-214260    8/2007
WO    WO 2011/040528    4/2011

OTHER PUBLICATIONS

International Search Report, PCT/JP2012/075695, Dec. 11, 2012.

*Primary Examiner* — Richard Booth
(74) *Attorney, Agent, or Firm* — Young & Thompson (57) ABSTRACT

Disclosed are an optical device, an optical element, and an image display device that can achieve an improved absorption efficiency of excitation light. The optical device includes: a light-emitting element; a carrier generation layer on which light from the light-emitting element is incident and in which carriers are generated; a plasmon excitation layer that excites a plasmon, stacked on the upper side of the carrier generation layer and has a plasma frequency higher than a frequency of light generated when the carrier generation layer is excited by the light from the light-emitting element; and an exit layer that converts light or a surface plasmon generated on a surface of the plasmon excitation layer into light having a predetermined exit angle and from which the light having the predetermined exit angle exits. The optical device further includes a polarization conversion layer on the lower side of the carrier generation layer.

20 Claims, 6 Drawing Sheets (51) Int. Cl.
*F21V 9/14* (2006.01)
*G02B 5/30* (2006.01)
*H01L 33/00* (2010.01)
*G02B 27/10* (2006.01)
*G02B 27/14* (2006.01)

(52) U.S. Cl.
CPC ............... *F21V 9/14* (2013.01); *G02B 27/102* (2013.01); *G02B 27/141* (2013.01)

OPTICAL DEVICE, OPTICAL ELEMENT, AND IMAGE DISPLAY DEVICE

TECHNICAL FIELD

The present invention relates to an optical device, an optical element, and an image display device.

BACKGROUND ART

In recent years, as a light source of an image display device such as a projector, there has been developed, for example, an optical device that includes: a light-emitting element; a light guide on which light (excitation light) from the light-emitting element is incident; a carrier generation layer that is provided in the light guide and in which carriers are generated by the light from the light guide; a plasmon excitation layer that excites a plasmon, which is stacked on the upper side of the carrier generation layer and has a plasma frequency higher than a frequency of light generated when the carrier generation layer is excited by the light from the light-emitting element; and an exit layer stacked on the plasmon excitation layer, which converts light incident from the plasmon excitation layer into light having a predetermined exit angle and from which the light having the predetermined exit angle exits (Patent Document 1).

Such an optical device emits light based on the principle to be described below. First, the carrier generation layer absorbs excitation light emitted from the light-emitting element, whereby carriers are generated in the carrier generation layer. These carriers couple to free electrons in the plasmon excitation layer and thus excite a surface plasmon. Then, the excited surface plasmon is emitted as light.

CITATION LIST

Patent Document(s)

Patent Document 1: WO 2011/040528 A1

SUMMARY OF THE INVENTION

Problem to be Solved by the Invention

In the optical device described in Patent Document 1 and the like, the improvement in luminous efficiency has been desired. In order to improve the luminous efficiency, it is an important factor to improve the absorption efficiency of excitation light emitted from the light-emitting element.

With the foregoing in mind, it is an object of the present invention to provide an optical device, an optical element, and an image display device that can achieve an improved absorption efficiency of excitation light.

Means for Solving Problem

In order to achieve the above object, the present invention provides an optical device including: a light-emitting element; a carrier generation layer on which light from the light-emitting element is incident and in which carriers are generated; a plasmon excitation layer that excites a plasmon, the plasmon excitation layer being stacked on an upper side of the carrier generation layer and having a plasma frequency higher than a frequency of light generated when the carrier generation layer is excited by the light from the light-emitting element; and an exit layer that converts light or a surface plasmon generated on a surface of the plasmon excitation layer into light having a predetermined exit angle and from which the light having the predetermined exit angle exits, wherein the optical device further includes a polarization conversion layer on a lower side of the carrier generation layer.

The present invention also provides an optical element including: a carrier generation layer on which light from the light-emitting element is incident and in which carriers are generated; a plasmon excitation layer that excites a plasmon, the plasmon excitation layer being stacked on an upper side of the carrier generation layer and having a plasma frequency higher than a frequency of light generated when the carrier generation layer is excited by the light; and an exit layer that converts light or a surface plasmon generated on a surface of the plasmon excitation layer into light having a predetermined exit angle and from which the light having the predetermined exit angle exits, wherein the optical element further comprises a polarization conversion layer on a lower side of the carrier generation layer.

The present invention also provides an image display device including: the optical device according to the present invention or the optical element according to the present invention; and an image display section that can display an image.

Effects of the Invention

According to the present invention, it is possible to provide an optical device, an optical element, and an image display device that can achieve an improved absorption efficiency of excitation light.

MODE FOR CARRYING OUT THE INVENTION

The optical device, the optical element, and the image display device according to the present invention will be described in detail below with reference to the accompanying drawings. It is to be noted, however, that the present invention is by no means limited to the following embodiments. In FIGS. 1 to 11 to be described below, the same components are given the same reference numerals, and duplicate explanations may be omitted. In the drawings, the structure of each component may be shown in an simplified form as appropriate for the sake of convenience in illustration, and also, each component may be shown schematically with a dimension ratio and the like that are different from the actual dimension ratio and the like.

(Embodiment 1)

An optical device of the present embodiment is an example of the optical device according to the present invention in which the polarization conversion layer is a ¼ wavelength plate. The structure of the optical device of the present embodiment is shown in the perspective view of FIG. 1.

Figure 1:
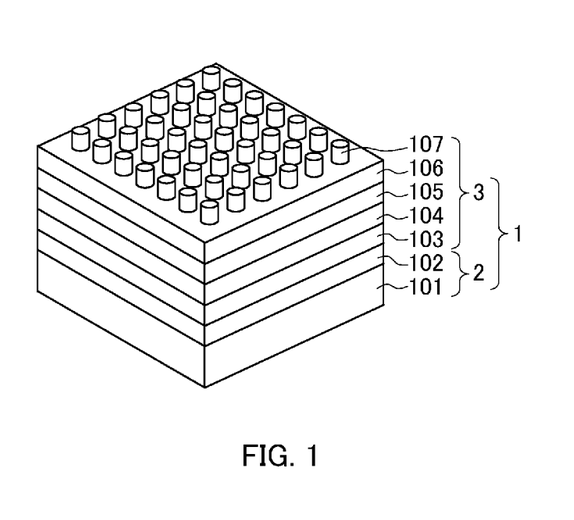
FIG. 1 is a perspective view schematically showing an example (Embodiment 1) of the structure of the optical device according to the present invention.

As shown in FIG. 1, the optical device 1 of the present embodiment includes, as main components, a light source section 2 and an optical control section 3. The light source section 2 includes a light-emitting element 101 and a ¼ wavelength plate 102. The ¼ wavelength plate 102 is stacked on the light-emitting element 101. The optical control section 3 includes: a carrier generation layer 103; a dielectric layer 104 stacked on the carrier generation layer 103; a plasmon excitation layer 105 stacked on the dielectric layer 104; a dielectric layer 106 stacked on the plasmon excitation layer 105; and a wave vector conversion layer 107 stacked on the dielectric layer 106. The wave vector conversion layer 107 serves as the "exit layer" in the present invention. The optical control section 3 is stacked on the light source section 2 with a surface of the optical control section 3 on the carrier generation layer 103 side facing a surface of the light source section 2 on the ¼ wavelength plate 102 side.

The optical device 1 is configured so that an excitation light incident side portion (hereinafter may be referred to simply as "incident side portion") has a lower effective dielectric constant than a light exit side portion (hereinafter may be referred to simply as "exit side portion"). The incident side portion includes: an entire structure provided on the light-emitting element 101-side of the plasmon excitation layer 105; and an ambient medium (hereinafter may be referred to simply as "medium") in contact with the light-emitting element 101. The entire structure includes the dielectric layer 104, the carrier generation layer 103, the ¼ wavelength plate 102, and the light-emitting element 101. The exit side portion includes: an entire structure provided on the wave vector conversion layer 107-side of the plasmon excitation layer 105; and a medium in contact with the wave vector conversion layer 107. The entire structure includes the dielectric layer 106 and the wave vector conversion layer 107. For example, in the case where the effective dielectric constant of the incident side portion is lower than the effective dielectric constant of the exit side portion even in the absence of the dielectric layers 104 and 106, the dielectric layers 104 and 106 are not necessarily essential components.

The effective dielectric constant ($\varepsilon_{eff}$) is represented by the following Equation (1), where an x axis and a y axis are directions parallel to an interface of the plasmon excitation layer 105; a z axis is a direction perpendicular to the interface of the plasmon excitation layer 105 (when the plasmon excitation layer 105 has a surface with recesses and projections, a direction perpendicular to the mean plane thereof); ω is an angular frequency of light exiting from the carrier generation layer 103 when the carrier generation layer 103 is excited independently by excitation light; $\varepsilon(\omega, x, y, z)$ is a dielectric constant distribution of dielectric substances in the incident side portion or the exit side portion with respect to the plasmon excitation layer 105; $k_{spp,z}$ is a z component of a wave number of a surface plasmon; j is an imaginary unit; and Re[ ] is a sign indicating a real part of a numerical value in the square brackets.

$$\varepsilon_{eff} = \left( \frac{\iiint_D \text{Re}\left[\sqrt{\varepsilon(\omega, x, y, z)}\right] \exp(2jk_{spp,z}z)}{\iiint_D \exp(2jk_{spp,z}z)} \right)^2 \quad (1)$$

The effective dielectric constant $\varepsilon_{eff}$ also may be calculated using the following Equation (7). However, it is particularly desirable to use Equation (1).

$$\varepsilon_{eff} = \frac{\iiint_D \text{Re}\left[\sqrt{\varepsilon(\omega, x, y, z)}\right] \exp(2jk_{spp,z}z)}{\iiint_D \exp(2jk_{spp,z}z)} \quad (7)$$

In Equations (1) and (7), an integration range D is the range of three-dimensional coordinates in the incident side portion or the exit side portion with respect to the plasmon excitation layer 105. In other words, the range of the x- and y-axis directions in this integration range D is a range extending to the outer peripheral surface of the entire structure in the incident side portion or to the outer peripheral surface of the entire structure in the exit side portion and not including the medium, which is a range up to the outer periphery within a plane parallel to the wave vector conversion layer 107-side surface of the plasmon excitation layer 105. The range of the z-axis direction in the integration range D is a range of the incident side portion or the exit side portion. It is to be noted here that, assuming that an interface between the plasmon excitation layer 105 and a layer having dielectric properties adjacent to the plasmon excitation layer 105 (the dielectric layer 104 or the dielectric layer 106) is a position where z=0, the range of the z-axis direction in the integration range D extends from the interface to the dielectric layer 104 side or the dielectric layer 106 side of the plasmon excitation layer 105 at infinity, and the direction away from the interface is set to a (+) z direction in Equations (1) and (7). For example, when the plasmon excitation layer 105 has a surface with recesses and projections, the effective dielectric constant can be determined from Equations (1) and (7) by moving the origin of the z-coordinate along the recesses and projections of the plasmon excitation layer 105. For example, when an optically anisotropic material is included in the calculation range of the effective dielectric constant, $\varepsilon(\omega, x, y, z)$ is a vector and has a different value for every radial direction perpendicular to the z axis. That is, the effective dielectric constants of the incident side portion and the exit side portion are present for every radial direction perpendicular to the z axis. In this case, the value of $\varepsilon(\omega, x, y, z)$ is set to a dielectric constant with respect to a direction parallel to the radial directions perpendicular to the z axis. Accordingly, all the phenomena to which the effective dielectric constant is relevant, such as $k_{spp,z}$, $k_{spp}$, and $d_{eff}$ to be described below, have different values for every radial direction perpendicular to the z axis.

Further, the z component $k_{spp,z}$ of the wave number of the surface plasmon and an x and y components $k_{spp}$ of the wave number of the surface plasmon are represented by the following Equation (2) and Equation (3), respectively, where $\in_{metal}$ is a real part of a dielectric constant of the plasmon excitation layer 105; and $k_o$ is a wave number of light in a vacuum.

$$k_{spp,z} = \sqrt{\varepsilon_{eff} k_0^2 - k_{spp}^2} \quad (2)$$

$$k_{spp} = k_0 \text{Re}\left[\sqrt{\frac{\varepsilon_{eff} \varepsilon_{metal}}{\varepsilon_{eff} + \varepsilon_{metal}}}\right] \quad (3)$$

Furthermore, in the optical device 1, the distance from the carrier generation layer 103-side surface of the plasmon excitation layer 105 to the plasmon excitation layer 105-side surface of the carrier generation layer 103 is set to be shorter than the effective interaction distance $d_{eff}$ of the surface plasmon. $d_{eff}$ is represented by the following Equation (4), where Im[ ] is a sign indicating an imaginary part of a numerical value in the square brackets, and the effective interaction distance of a surface plasmon is the distance where the intensity of the surface plasmon is $e^{-2}$.

$$d_{eff} = \text{Im}\left[\frac{1}{k_{spp,z}}\right] \quad (4)$$

Thus, the effective dielectric constant $\in_{effin}$ of the incident side portion and the effective dielectric constant $\in_{effout}$ of the exit side portion with respect to the plasmon excitation layer 105 are determined, respectively, based on Equation (1) or (7) and Equations (2) and (3) to which, as $\in(\omega, x, y, z)$, a real part $\in_{in}(\omega, x, y, z)$ of the dielectric constant distribution in the incident side portion with respect to the plasmon excitation layer 105 and a real part $\in_{out}(\omega, x, y, z)$ of the dielectric constant distribution in the exit side portion with respect to the plasmon excitation layer 105 are substituted, respectively. For example, when there is dielectric constant anisotropy in a plane perpendicular to the z axis, the effective dielectric constants of the incident side portion and the exit side portion are present for every radial direction perpendicular to the z axis. Accordingly, as described above, all the phenomena to which the effective dielectric constant is relevant, such as $k_{spp,z}$ and $k_{spp}$, as well as $d_{eff}$ to be described below, have different values for every radial direction perpendicular to the z axis. In practice, by giving an appropriate initial value as the effective dielectric constant $\in_{eff}$ and repeatedly calculating Equation (1) or (7) and Equations (2) and (3), the effective dielectric constant $\in_{eff}$ can be determined easily. For example, when the real part of the dielectric constant of the layer in contact with the plasmon excitation layer 105 is very large, the z component $k_{spp,z}$ of the wave number of a surface plasmon represented by Equation (2) becomes a real number. This means that no surface plasmon is generated at their interface. Thus, the dielectric constant of the layer in contact with the plasmon excitation layer 105 corresponds to the effective dielectric constant in this case. In embodiments to be described below, the definition of the effective dielectric constant is the same as that in Equation (1) or (7).

In the optical device 1, the ¼ wavelength plate 102 is disposed between the light-emitting element 101 and the carrier generation layer 103. With this configuration, the optical device 1 can exhibit improved absorption efficiency of excitation light, i.e., improved coupling efficiency to a waveguide composed of the carrier generation layer 103, the dielectric layer 104, and the plasmon excitation layer 105 (hereinafter may be referred to simply as "waveguide"). The reason why the optical device 1 exhibits such an effect will be described in detail below.

In order to improve the luminous efficiency of an optical device, it is important to improve the absorptance of excitation light from a light-emitting element. The inventors of the present invention conducted diligent studies from the viewpoint of improving the absorption efficiency of excitation light. As a result, they found out that the absorption efficiency of excitation light in a carrier generation layer greatly depends on polarization properties of the excitation light. The inventors of the present invention further found out that the above-described absorption efficiency also depends on an incident angle of the excitation light. These facts were first discovered by the inventors of the present invention. The polarization dependency and the incident angle dependency of the absorption efficiency will be described more specifically on the basis of the optical device 1 of the present embodiment.

Figure 2:
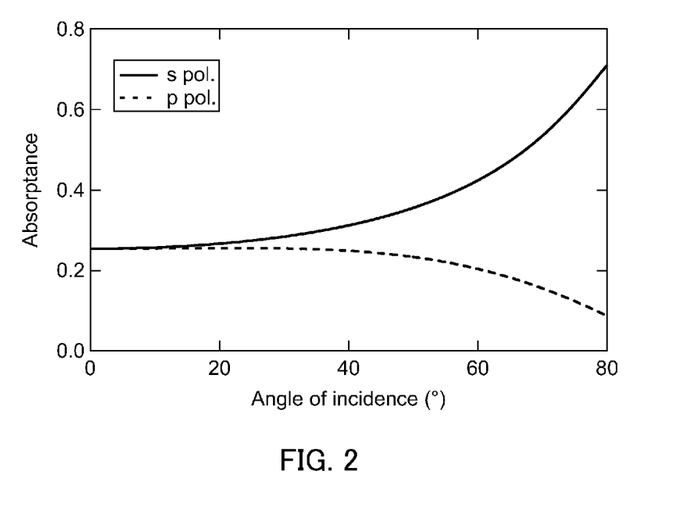
FIG. 2 shows the incident angle dependency and the polarization dependency of the absorptance of excitation light in a carrier generation layer.

FIG. 2 shows the incident angle dependency and the polarization dependency of the absorptance of excitation light in the carrier generation layer 103. In the example shown in FIG. 2, the conditions of the optical device 1 are set as shown below. In this example, light reflected by the plasmon excitation layer 105 is not reused. In the present embodiment, the "incident angle" means, when light (a light beam) emitted from the light-emitting element 101 is incident on the carrier generation layer 103 (the optical control section 3), an angle that is formed between the light beam and the normal to the incident surface of the carrier generation layer 103. Throughout the description regarding the present invention, the term "incident angle" indicated the same concept as described above.

light-emitting element 101: laser diode (emission wavelength: 460 nm)
carrier generation layer 103: forming material: fluorescent material (refractive index: 1.7+0.03 j), thickness: 50 nm
dielectric layer 104: forming material: $SiO_2$, thickness: 10 nm
plasmon excitation layer 105: forming material: Ag, thickness: 50 nm
dielectric layer 106: forming material: $TiO_2$, thickness: 0.5 mm
wave vector conversion layer 107: hemispherical lens, diameter: 10 mm As shown in FIG. 2, as the incident angle of excitation light on the carrier generation layer 103 becomes larger, the absorptance increases greatly in the case where the polarization of the excitation light is s polarization, whereas the absorptance decreases greatly in the case where the polarization of the excitation light is p polarization. As such, it can be seen that the absorption efficiency depends on the polarization of the excitation light and the incident angle.

Figure 3:
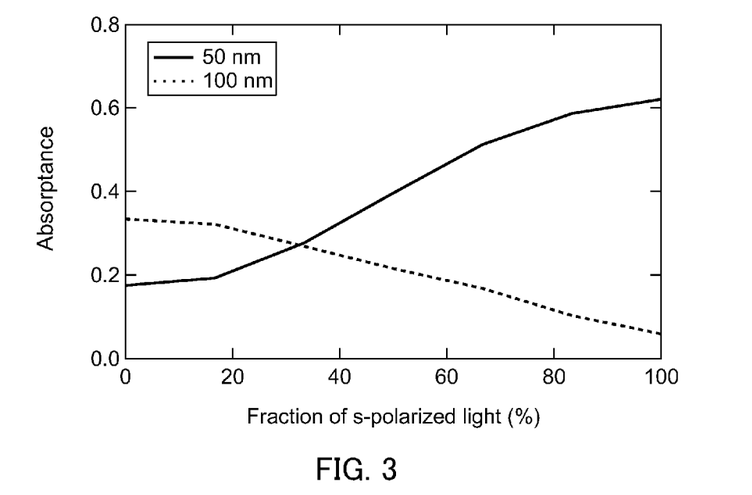
FIG. 3 shows the dependency of the absorptance of excitation light on the thickness of the carrier generation layer.

FIG. 3 shows the relationship between the absorptance of excitation light and the thickness of the carrier generation layer 103. In the example shown in FIG. 3, the same conditions as in the example shown in FIG. 2 are used, except that the thickness of the carrier generation layer 103 is set to 50 nm or 100 nm and the incident angle of the excitation light is set to 70°. In FIG. 3, the horizontal axis indicates the proportion of an s-polarization component in the excitation light, where 100% indicates that the excitation light consists only of s-polarized light, and 0% indicates that the excitation light consists only of p-polarized light. As shown in FIG. 3, when the thickness of the carrier generation layer 103 is 50 nm, the absorptance of excitation light is improved as the s-polarization component in the excitation light increases. On the other hand, when the thickness of the carrier generation layer 103 is 100 nm, the absorptance of excitation light is improved as the s-polarization component in the excitation light decreases, i.e., as the p polarization component in the excitation light increases. It can be said that it is common to both the conditions that the absorptance reaches its maximum when the excitation light is either s-polarized light or p-polarized light. It also can be said that the absorptance never reaches its maximum when the excitation light is in a polarization state between s-polarization and p-polarization, i.e., in an intermediate polarization state.

Figure 4:
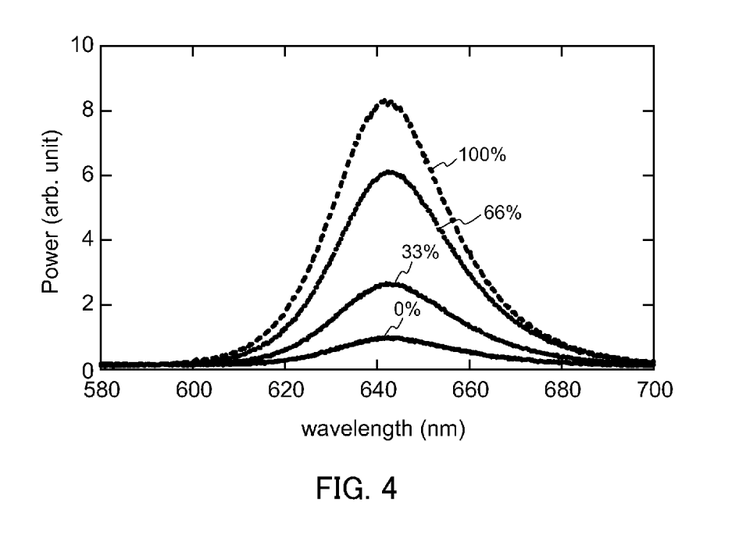
FIG. 4 shows emission spectra from the optical device when the carrier generation layer has a thickness of 50 nm.

FIG. 4 shows emission spectra from the optical device 1 when the carrier generation layer 103 has a thickness of 50 nm in the example shown in FIG. 3. In FIG. 4, "0%", "33%", "66%", and "100%" each indicate the proportion of the s-polarization component in the excitation light. In FIG. 4, the vertical axis is normalized assuming that the emission spectrum obtained when the excitation light is p-polarized light ("0%" in FIG. 4) is 1. As shown in FIG. 4, the emission power reaches its maximum when the excitation light is s-polarized light (100%), and the maximum emission power was 8 times as great as the emission power obtained when the excitation light was p-polarized light (0%). From the comparison with FIG. 3, it can be seen that there is a correlation (e.g., proportional relation) between the amount of excitation light absorbed by the carrier generation layer 103 and the emission power.

Figure 5:
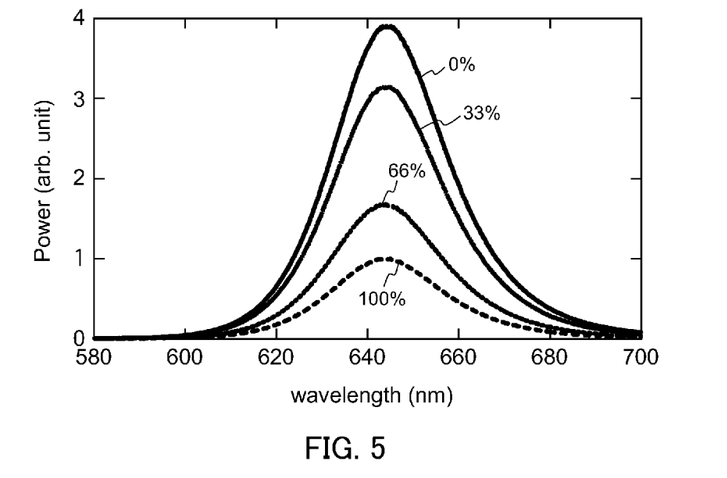
FIG. 5 shows emission spectra from the optical device when the carrier generation layer has a thickness of 100 nm.

FIG. 5 shows emission spectra from the optical device 1 when the carrier generation layer 103 has a thickness of 100 nm in the example shown in FIG. 3. In FIG. 5, "0%", "33%", "66%", and "100%" each indicate the proportion of the s-polarization component in the excitation light. In FIG. 5, the vertical axis is normalized assuming that the emission spectrum obtained when the excitation light is p-polarized light ("100%" in FIG. 5) is 1. As shown in FIG. 5, the emission power reached its maximum when the excitation light was p-polarized light (0%), and the maximum emission power was 4 times as great as the emission power obtained when the excitation light was s-polarized light (100%). From the comparison with FIG. 3, it can be seen that, similarly to the case where the thickness of the carrier generation layer 103 is 50 nm, there is a correlation (e.g., proportional relation) between the amount of excitation light absorbed by the carrier generation layer 103 and the emission power.

As specifically described above, the absorption efficiency of excitation light in the carrier generation layer depends on polarization of the excitation light, and the absorption efficiency reaches its maximum when the excitation light is either s-polarized or p-polarized light, depending on the thickness of the carrier generation layer. On this account, it was found out that the absorption efficiency of excitation light can be improved by causing only s-polarized light or p-polarized light to be incident on a carrier generation layer depending on the thickness of the carrier generation layer. Based on this finding, the inventors of the present invention conceived disposing the polarization conversion layer at the above-described predetermined position, thereby causing excitation light to be polarized light (s-polarized light or p-polarized light) that is absorbed by the carrier generation layer, as specifically described below, and thus, they achieved the present invention. According to the present invention, by the improvement of the absorption efficiency of excitation light, it is possible to realize an optical device having a high luminous efficiency and a high light output rating, for example.

Figure 6:
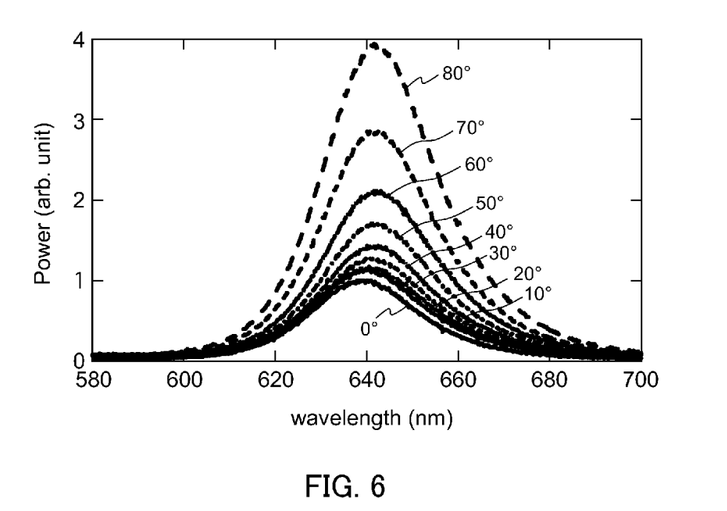
FIG. 6 shows the dependency of emission spectra from the optical device on the incident angle of excitation light.

FIG. 6 shows the relationship between the emission spectra from the optical device 1 of the example shown in FIG. 2 and the incident angle of excitation light. In FIG. 6, "0°", "10°", "20°", "30°", "40°", "50°", "60°", "70°", and "80°" each indicate the incident angle of the excitation light. In FIG. 6, the vertical axis is normalized assuming that the emission spectrum obtained when the incident angle of the excitation light is 0° is 1. As shown in FIG. 6, as the incident angle of the excitation light on the carrier generation layer 103 becomes larger, the emission power is improved. From the comparison with FIG. 2, it can be seen that there is a correlation (e.g., proportional relation) between the amount of excitation light absorbed by the carrier generation layer 103 and the emission power.

As described above, for example, as the incident angle of light incident on the carrier generation layer 103 becomes relatively larger, the polarization dependency of the absorptance of the excitation light increases. Focusing on either one type of polarization (s-polarization or p-polarization), the absorptance of excitation light in the carrier generation layer 103 can be improved as compared with the case where the incident angle is small.

Next, regarding the optical device 1, an operation in which light emitted from the light-emitting element 101 (hereinafter may be referred to simply as "excitation light") is incident on the optical control section 3 and light then exits from the wave vector conversion layer 107 will be described.

Excitation light emitted from the light-emitting element 101 passes through the ¼ wavelength plate 102 and is incident on the optical control section 3. Then, the excitation light couples to the waveguide, and is confined in the waveguide. This confined excitation light excites the carrier generation layer 103, whereby carriers are generated in the carrier generation layer 103. These carriers couple to free electrons in the plasmon excitation layer 105 across the dielectric layer 104, thereby exciting a surface plasmon at the interface between the dielectric layer 104 and the plasmon excitation layer 105. The excited surface plasmon is radiated from the interface between the plasmon excitation layer 105 and the dielectric layer 106 as light (hereinafter may be referred to as "radiated light"). The radiation of the light occurs when the effective dielectric constant of the incident side portion is lower than the effective dielectric constant of the exit side portion. The wavelength of the radiated light is equal to the wavelength of light generated when the carrier generation layer 103 is excited independently. The radiation angle $\theta_{out}$ of the radiated light is represented by the following Equation (5), where $n_{out}$ is a refractive index of the dielectric layer 106.

$$\theta_{out} = \sin^{-1}\left(\frac{k_{spp}}{n_{out}k_0}\right) \quad (5)$$

The wave number of the excited surface plasmon is present only in the vicinity of the value set uniquely by Equation (2). The radiated light is obtained by merely converting to the wave vector of the surface plasmon. Thus, the radiation angle of the radiated light is determined uniquely, and the polarization state of the radiated light is always p-polarization. That is, the radiated light is p-polarized light having a very high directivity. The radiated light is incident on the wave vector conversion layer 107. By the wave vector conversion layer 107, the radiated light is diffracted or refracted and then extracted to the outside of the optical device 1.

As described above, the absorption efficiency of excitation light in the carrier generation layer depends on the polarization of the excitation light. Thus, among excitation lights incident on the carrier generation layer 103, polarized light (s-polarized light or p-polarized light) that has not absorbed by the carrier generation layer 103 passes through the carrier generation layer 103. Then, the polarized light is reflected by the plasmon excitation layer 105. The reflected light passes through the dielectric layer 104, the carrier generation layer 103, and the ¼ wavelength plate 102, and is reflected by the light-emitting element 101. The reflected light then passes through the ¼ wavelength plate 102, and again is incident on the carrier generation layer 103. During this process, the light has passed through the ¼ wavelength plate 102 twice. As a result, the polarization state thereof becomes orthogonal to the polarization state at the time when it was incident on the carrier generation layer 103 before being reflected by the plasmon excitation layer 105. That is, s-polarized light has turned to p-polarized light, and p-polarized light has turned to s-polarized light. Accordingly, the excitation light incident on the carrier generation layer 103 again is partially absorbed by the carrier generation layer 103. As a result, in the optical device 1, it is possible to improve the absorption efficiency of the excitation light. In the optical device 1, the above-described operation is repeated until, for example, the excitation light is entirely absorbed by the carrier generation layer 103 or is extracted from the light source section 2 to the outside without passing through the optical control section 3.

The light-emitting element 101 emits light (excitation light) having a wavelength that can be absorbed by the carrier generation layer 103. Specific examples of the light-emitting element 101 include a light-emitting diode (LED), a laser diode, and a super luminescent diode. As described above, as the incident angle of the excitation light on the carrier generation layer 103 becomes larger, the absorption efficiency of the excitation light is improved. Thus, the incident angle preferably is 40° or more, more preferably 60° or more, and still more preferably 70° or more.

As the ¼ wavelength plate 102, a conventionally known ¼ wavelength plate can be used, and examples thereof include: a ¼ wavelength plate formed using a birefringent material such as a quartz crystal or a polymer; and a ¼ wavelength plate utilizing a structural birefringence provided by a minute structure smaller than the wavelength of the excitation light.

The carrier generation layer 103 is a layer that absorbs the excitation light and in which carriers are generated. The carrier generation layer 103 contains a light-emitting material, for example. The light-emitting material is a fluorescent material, a phosphorescent material, or the like, for example. Examples of the fluorescent material include organic fluorescent materials, inorganic fluorescent materials, quantum dot fluorescent materials, and semiconductor fluorescent materials. Examples of the organic fluorescent materials include rhodamines (Rhodamine 6G) and sulforhodamine (Sulforhodamine 101). Examples of the inorganic fluorescent materials include $Y_2O_2S$:Eu, $BaMgAl_xO_y$:Eu, and $BaMgAl_xO_y$:Mn. Examples of the quantum dot fluorescent materials include quantum dots such as CdSe and CdSe/ZnS. Examples of the semiconductor fluorescent materials include fluorescent materials of inorganic semiconductors and organic semiconductors. Examples of the inorganic semiconductors include GaN and GaAs. Examples of the organic semiconductors include (thiophene/phenylene)co-oligomers and Alq3 (tris(8-quinolinolato)aluminum). The carrier generation layer 103 may be formed using a plurality of materials that generate light having a plurality of wavelengths with the same or different emission wavelengths, for example. The thickness of the carrier generation layer 103 is not particularly limited, and preferably is not more than 1 μm, particularly preferably not more than 100 nm, for example.

The carrier generation layer 103 may contain metal particles, for example. The metal particles interact with the excitation light, thereby exciting a surface plasmon on their surfaces. The metal particles thus induce an enhanced electric field with an intensity nearly 100 times higher than the intensity of the electric field of the excitation light in the vicinity of their surfaces. By this enhanced electric field, carriers to be generated in the carrier generation layer 103 can be increased, so that, for example, it is possible to improve the utilization efficiency of the excitation light in the optical control section 3.

Examples of a metal as the material of the metal particles include gold, silver, copper, platinum, palladium, rhodium, osmium, ruthenium, iridium, iron, tin, zinc, cobalt, nickel, chromium, titanium, tantalum, tungsten, indium, aluminum, and alloys containing two or more of them. Among them, the metal preferably is gold, silver, copper, platinum, aluminum, or an alloy containing any of them as a main component, and particularly preferably is gold, silver, aluminum, or an alloy containing any of them as a main component. The metal particles may have, for example, a core-shell structure in which a peripheral portion and a central portion are formed of different metals; a semi-sphere combining structure in which two kinds of metal semi-spheres are combined with each other; or a cluster-in-cluster structure in which different clusters aggregate to form particles. By forming the metal particles using the above-described alloy or so as to have any of the above-described special structures, for example, the resonance wavelength can be controlled without changing the dimension, shape, or the like of the metal particles.

The shape of the metal particle is not limited as long as it has a closed surface, and examples thereof include a rectangular parallelepiped, a cube, an ellipsoid, a sphere, a triangular pyramid, and a triangular prism. Examples of the metal particle include a structure composed of a closed surface with the length of each side being less than 10 μm, which is obtained by processing a metal thin film by micromachining typified by a semiconductor lithography technique. The size of the metal particle is, for example, in the range from 1 to 100 nm, preferably from 5 to 70 nm, and more preferably from 10 to 50 nm.

The plasmon excitation layer 105 is a fine particle layer or a thin film layer formed of a material having a plasma frequency higher than the frequency of light generated by the carrier generation layer 103 (hereinafter may be referred to simply as "light emission frequency") when the carrier generation layer 103 is excited independently by excitation light. That is, the plasmon excitation layer 105 has a negative dielectric constant at the light emission frequency. On the carrier generation layer 103 side of the plasmon excitation layer 105 and within an effective interaction distance of a surface plasmon represented by Equation (4) from the carrier generation layer 103-side interface of the plasmon excitation layer 105, part of a dielectric layer having optical anisotropy may be disposed, for example. This dielectric layer has optical anisotropy such that, for example, the dielectric constant varies depending on a direction within a plane perpendicular to the stacking direction of the components in this optical control section 3, in other words, within a plane parallel to the interfaces of the respective layers. That is, within the plane perpendicular to the stacking direction of the components in this optical control section 3, this dielectric layer shows a magnitude relation between the dielectric constant in a certain direction and the dielectric constant in a direction orthogonal to this direction. By this dielectric layer, within the plane perpendicular to the stacking direction of the components in the optical device 1, the effective dielectric constant of the incident side portion in a certain direction is different from that in a direction orthogonal to this direction. By setting the effective dielectric constant of the incident side portion in the certain direction to be high enough not to cause plasmon coupling and setting the effective dielectric constant of the incident side portion in the direction orthogonal to this direction to be low enough to cause plasmon coupling, it is possible to, for example, further limit the incident angle and the polarization of light incident on the wave vector conversion layer 107. Thus, it is possible to further improve the light extracting efficiency by the wave vector conversion layer 107, for example.

Theoretically, when the sum of the effective dielectric constant of the incident side portion and the dielectric constant of the plasmon excitation layer 105 is negative or 0, carriers generated in the carrier generation layer 103 excite a surface plasmon on the plasmon excitation layer 105. On the other hand, when the sum is positive, the carriers do no excite the surface plasmon. In other words, the effective dielectric constant high enough not to cause plasmon coupling as described above is a dielectric constant such that the sum of the dielectric constant of the plasmon excitation layer 105 and the effective dielectric constant of the incident side portion is positive, while the effective dielectric constant low enough to cause plasmon coupling as described above is a dielectric constant such that the sum of the dielectric constant of the plasmon excitation layer 105 and the effective dielectric constant of the incident side portion is negative or 0. The efficiency at which the carriers generated in the carrier generation layer 103 couple to the surface plasmon is the condition where the sum of the effective dielectric constant of the incident side portion and the dielectric constant of the plasmon excitation layer 105 is 0. Therefore, the condition where the sum of the dielectric constant of the plasmon excitation layer 105 and a minimum value of the effective dielectric constant of the incident side portion is 0 is most preferable from the viewpoint of improving the directivity with respect to the azimuth angle. However, under the above-described condition, for example, the directivity with respect to the azimuth angle may be too high, which brings about the risk that the amount of emitted light that passes through the plasmon excitation layer 105 may be decreased and heat may be generated in the plasmon excitation layer 105 owing to the decrease in the amount of the emitted light. Thus, in practice, it is preferable not to make the directivity with respect to the azimuth angle too high. Specifically, under the condition where the sum of the dielectric constant of the plasmon excitation layer 105 and an intermediate value of the effective dielectric constant of the incident side portion is 0, high-directivity radiation can be obtained at an azimuth angle in the range from 315° to 45° and in the range from 135° to 225°, for example. Accordingly, it is possible to achieve both the improvement in the directivity with respect to the azimuth angle and the suppression of a decrease in the amount of the emitted light, for example. Examples of the material forming the dielectric layer with optical anisotropy include anisotropic crystals such as $TiO_2$, $YVO_4$, and $Ta_2O_5$. The dielectric layer may have a structure obtained by obliquely vapor-depositing or obliquely sputtering a dielectric substance on a film, for example.

Examples of the material forming the plasmon excitation layer 105 include gold, silver, copper, platinum, palladium, rhodium, osmium, ruthenium, iridium, iron, tin, zinc, cobalt, nickel, chromium, titanium, tantalum, tungsten, indium, aluminum, and alloys containing two or more of them. Among them, the above-described forming material preferably is gold, silver, copper, platinum, aluminum, or a mixture with a dielectric substance, containing any of them as a main component, and particularly preferably is gold, silver, aluminum, or a mixture with a dielectric substance, containing any of them as a main component. The thickness of the plasmon excitation layer 105 is not particularly limited, and preferably is not more than 200 nm, particularly preferably about 10 to 100 nm.

The carrier generation layer 103-side surface of the plasmon excitation layer 105 may be roughened, for example. The rough surface causes, for example, scattering of the excitation light and excitation of localized plasmon at sharp-pointed parts on the rough surface, thereby increasing carriers to be excited in the carrier generation layer 103. As a result, for example, it is possible to improve the utilization efficiency of excitation light in the optical control section 3.

The dielectric layer 104 is a layer containing a dielectric substance. Specifically, the dielectric layer 104 may be, for example, an $SiO_2$ nano-rod array film; or a thin film or porous film formed of $SiO_2$, $AlF_3$, $MgF_2$, $Na_3AlF_6$, NaF, LiF, $CaF_2$, $BaF_2$, a low dielectric constant plastic, or the like. The thickness of the dielectric layer 104 is not particularly limited, and is, for example, in the range from 1 to 100 nm, preferably from 5 to 50 nm, and more preferably from 5 to 20 nm.

Examples of the material forming the dielectric layer 106 include high dielectric constant materials such as diamond, $TiO_2$, $CeO_2$, $Ta_2O_5$, $ZrO_2$, $Sb_2O_3$, $HfO_2$, $La_2O_3$, $NdO_3$, $Y_2O_3$, ZnO, and $Nb_2O_5$. The thickness of the dielectric layer 106 is not particularly limited.

The wave vector conversion layer 107 is an exit section that causes light radiated from the interface between the plasmon excitation layer 105 and the dielectric layer 106 to exit from the optical device 1 by converting the wave vector thereof. The wave vector conversion layer 107 has a function of causing the light to exit from the optical device 1 so as to be substantially orthogonal to the interface between the plasmon excitation layer 105 and the dielectric layer 106.

Examples of the shape of the wave vector conversion layer 107 include: a surface-relief grating; a periodic structure typified by a photonic crystal, or a quasi-periodic structure; a texture structure larger than the wavelength of light emitted from the optical device 1 (e.g., a surface structure provided by a rough surface); a hologram; and a microlens array. The quasi-periodic structure is, for example, an incomplete periodic structure in which a part of the periodic structure is missing. From the viewpoint of improving the light extracting efficiency and controlling the directivity, the shape preferably is the periodic structure typified by a photonic crystal, the quasi-periodic structure, the microlens array, or the like. The photonic crystal preferably is the one whose crystal structure is a triangular lattice structure. The wave vector conversion layer 107 may have a structure that includes protrusions on a flat-plate like base, for example.

As described above, in the optical device 1, the distance from the carrier generation layer 103-side surface of the plasmon excitation layer 105 to the plasmon excitation layer 105-side surface of the carrier generation layer 103 is set to be shorter than the effective interaction distance $d_{eff}$ of the surface plasmon. With this configuration, carriers generated in the carrier generation layer 103 can be coupled to free electrons in the plasmon excitation layer 105 efficiently. As a result, the luminous efficiency can be improved, for example. A region where a high coupling efficiency is achieved is, for example, a region extending from a position where carriers are generated in the carrier generation layer 103 (e.g., a position where a fluorescent material is present in the carrier generation layer 103) to the carrier generation layer 103-side surface of the plasmon excitation layer 105. The region is very narrow with a size of about 200 nm, for example. For example, the region is in the range from 1 to 200 nm or from 10 to 100 nm. In the optical device 1, when the region is in the range from 1 to 200 nm, the carrier generation layer 103 preferably is disposed within a distance in the range from 1 to 200 nm from the plasmon excitation layer 105, for example. When the region is in the range from 10 to 100 nm, the carrier generation layer 103 preferably is disposed within a distance in the range from 10 to 100 nm from the plasmon excitation layer 105, for example, and specifically, the thickness of the dielectric layer 104 is set to 10 nm and the thickness of the carrier generation layer 103 is set to 90 nm, for example. From the viewpoint of light extracting efficiency, it is preferable to make the carrier generation layer 103 thinner. On the other hand, from the viewpoint of light output rating, it is preferable to make the carrier generation layer 103 thicker. Therefore, the thickness of the carrier generation layer 103 is determined based on the required light extracting efficiency and light output rating, for example. The range of the region varies depending on the dielectric constant and the like of the dielectric layer disposed between the carrier generation layer and the plasmon excitation layer. Thus, for example, the thickness of the dielectric layer, the thickness of the carrier generation layer, etc. can be set as appropriate considering the range of the region under predetermined conditions.

In the optical device of the present embodiment shown in FIG. 1, the ¼ wavelength plate is disposed between the light-emitting element and the carrier generation layer. It is to be noted, however, that the present invention is not limited to this example. Because the excitation light is multiple-reflected, the ¼ wavelength plate may be disposed at any position on the lower side of the carrier generation layer (i.e., the light-emitting element side of the carrier generation layer). By disposing the ¼ wavelength plate as described above, the excitation light passes through the ¼ wavelength plate two or more times, so that the above-described effect is obtained. The ¼ wavelength plate may be disposed, for example, on the side opposite to the carrier generation layer side of the light-emitting element. For example, the ¼ wavelength plate may be included in the light-emitting element. Although the ¼ wavelength plate is used as the polarization conversion layer, the present invention is not limited to this example. The polarization conversion layer is not limited as long as it can act on the polarization of the excitation light so as to convert s-polarization to p-polarization and p-polarization to s-polarization, as described above. For example, the use of two ⅛ wavelength plates brings about the same effect as in the case where the ¼ wavelength plate is used.

In the optical device of the present embodiment, the plasmon excitation layer is sandwiched between the two dielectric layers. It is to be noted, however, that the dielectric layers are not essential in the present invention, and for example, the plasmon excitation layer may be disposed on the carrier generation layer. Also, the dielectric layer may be stacked only on one surface of the plasmon excitation layer. Furthermore, although the light source section and the optical control section are stacked in contact with each other, the light source section and the optical control section may be disposed apart from each other, for example. Moreover, the light source section may include a plurality of light-emitting elements, for example.

In the optical device of the present embodiment, the excitation light from the light-emitting element is incident on the ¼ wavelength plate. It is to be noted, however, that the present invention is not limited to this example. The excitation light may be incident on the ¼ wavelength plate via a light guide, for example. The shape of the light guide may be, for example: a rectangular parallelepiped or a wedge shape; or a shape having a structure for light extraction in its light exit section or inside the light guide. The structure for light extraction preferably is the one having a function of converting the incident angle of the excitation light on the carrier generation layer to an angle that allows the absorptance of the excitation light to be improved, for example. Surfaces of the light guide excluding the light exit section preferably are treated using, for example, a reflective material or a dielectric multilayer film or the like so as to prevent the excitation light from exiting from these surfaces.

(Embodiment 2)

Figure 7:
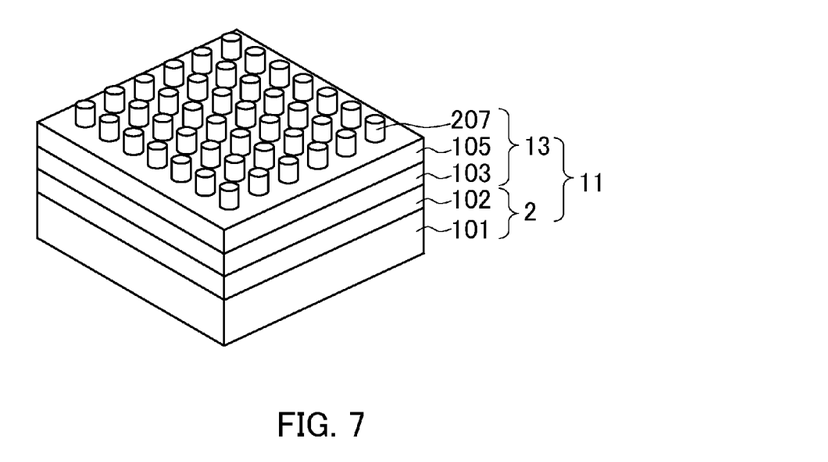
FIG. 7 is a perspective view schematically showing another example (Embodiment 2) of the structure of the optical device according to the present invention.

An optical device of the present embodiment is another example of the optical device according to the present invention in which the polarization conversion layer is a ¼ wavelength plate. The structure of the optical device of the present embodiment is shown in the perspective view of FIG. 7. The optical device of the present embodiment has the same structure as the optical device of Embodiment 1, except that the optical control section does not include any dielectric layer. As shown in FIG. 7, the optical device 11 of the present embodiment includes, as main components, a light source section 2 and an optical control section 13. The light source section 2 includes a light-emitting element 101 and a ¼ wavelength plate 102. The ¼ wavelength plate 102 is stacked on the light-emitting element 101. The optical control section 13 includes a carrier generation layer 103, a plasmon excitation layer 105 stacked on the carrier generation layer 103, and a wave vector conversion layer (exit layer) 207 stacked on the plasmon excitation layer 105. The optical control section 13 is stacked on the light source section 2 with a surface of the optical control section 13 on the carrier generation layer 103 side facing a surface of the light source section 2 on the ¼ wavelength plate 102 side.

The optical device 11 is configured so that the effective dielectric constant of an incident side portion is higher than or equal to the effective dielectric constant of an exit side portion. The incident side portion includes: an entire structure provided on the light-emitting element 101-side of the plasmon excitation layer 105; and a medium in contact with the light-emitting element 101. The entire structure includes the carrier generation layer 103, the ¼ wavelength plate 102, and the light-emitting element 101. The exit side portion includes: an entire structure provided on the wave vector conversion layer 207-side of the plasmon excitation layer 105; and a medium in contact with the wave vector conversion layer 207. The entire structure includes the wave vector conversion layer 207.

Next, regarding the optical device 11, an operation in which excitation light from the light-emitting element 101 is incident on the optical control section 13 and light then exits from the wave vector conversion layer 207 of the optical control section 13 will be described.

Excitation light emitted from the light-emitting element 101 passes through the ¼ wavelength plate 102 and is incident on the carrier generation layer 103 of the optical control section 13. Then, the excitation light couples to the waveguide, and is confined in the waveguide. By this confined excitation light, part of the excitation light that has entered the carrier generation layer 103 is absorbed by the carrier generation layer 103, whereby carriers are generated in the carrier generation layer 103. These carriers couple to free electrons in the plasmon excitation layer 105, thereby exciting surface plasmons at the interface between the carrier generation layer 103 and the plasmon excitation layer 105 and at the interface between the plasmon excitation layer 105 and the wave vector conversion layer 207. The surface plasmon excited at the interface between the carrier generation layer 103 and the plasmon excitation layer 105 propagates to the interface between the plasmon excitation layer 105 and the wave vector conversion layer 207 by passing through the plasmon excitation layer 105. As described above, the optical device 11 is configured so that the effective dielectric constant of the incident side portion is higher than or equal to the effective dielectric constant of the exit side portion, and ends of the wave vector conversion layer 207 on the plasmon excitation layer 105 side are disposed so that the distance between the ends and the wave vector conversion layer 207-side surface of the plasmon excitation layer 105 is within an effective interaction distance of the surface plasmon. When the wave vector conversion layer 207 is a flat dielectric layer, the surface plasmon is not converted to light at its interface. Because the wave vector conversion layer 207 has a function of extracting a surface plasmon as light (e.g., a diffracting action), the surface plasmon at the interface is radiated as light to the outside of the optical device 11. The wavelength of the radiated light is equal to the wavelength of light generated when the carrier generation layer 103 is excited independently. The radiation angle $\theta_{rad}$ of the radiated light is represented by the following Equation (6), where $\Lambda$ is a pitch of the periodic structure of the wave vector conversion layer 207, and $n_{rad}$ is a refractive index on the light extraction side of the wave vector conversion layer 207 (i.e., the medium in contact with the wave vector conversion layer 207).

$$\theta_{rad} = \sin^{-1}\left(\frac{k_{spp} - i\frac{2\pi}{\Lambda}}{n_{rad}k_0}\right) \quad (6)$$

The wave number of the surface plasmon excited at the interface between the carrier generation layer 103 and the plasmon excitation layer 105 is present only in the vicinity of the value set uniquely by Equation (2). The same applies to the wave number of the surface plasmon excited at the interface between the plasmon excitation layer 105 and the wave vector conversion layer 207. Thus, the radiation angle of the radiated light is determined uniquely, and the polarization state of the radiated light is always p-polarization. That is, the radiated light is p-polarized light having a very high directivity.

Among excitation lights incident on the carrier generation layer 103, polarized light (s-polarized light or p-polarized light) that has not absorbed by the carrier generation layer 103 passes through the carrier generation layer 103. Then, the polarized light is reflected by the plasmon excitation layer 105. The reflected light passes through the carrier generation layer 103 and the ¼ wavelength plate 102, and is reflected by the light-emitting element 101. The reflected light then passes through the ¼ wavelength plate 102, and again is incident on the carrier generation layer 103. During this process, the light has passed through the ¼ wavelength plate 102 twice. As a result, the polarization state thereof becomes orthogonal to the polarization state at the time when it was incident on the carrier generation layer 103 before being reflected by the plasmon excitation layer 105. That is, s-polarized light has turned to p-polarized light, and p-polarized light has turned to s-polarized light. Accordingly, the excitation light incident on the carrier generation layer 103 again is partially absorbed by the carrier generation layer 103. As a result, in the optical device 11, it is possible to improve the absorption efficiency of the excitation light. In the optical device 11, the above-described operation is repeated until, for example, the excitation light is entirely absorbed by the carrier generation layer 103 or is extracted from the light source section 2 to the outside without passing through the optical control section 13.

The wave vector conversion layer 207 is an exit section that converts the wave vector of the surface plasmon excited at the interface between the plasmon excitation layer 105 and the wave vector conversion layer 207 so as to extract the surface plasmon from the interface as light and causes the light to be radiated from the optical device 11. That is, the wave vector conversion layer 207 converts the surface plasmon to light having a predetermined radiation angle and causes the light to be radiated from the optical device 11. Furthermore, the wave vector conversion layer 207 has a function of, for example, causing the radiated light to be radiated from the optical device 11 so as to be substantially orthogonal to the interface between the plasmon excitation layer 105 and the wave vector conversion layer 207. As the wave vector conversion layer 207, those given as examples of the wave vector conversion layer 107 in Embodiment 1 also are applicable, for example.

In the optical device of the present embodiment shown in FIG. 7, the carrier generation layer is disposed in contact with the plasmon excitation layer. It is to be noted, however, that the present invention is not limited to this example. Between the carrier generation layer and the plasmon excitation layer, a dielectric layer having a thickness smaller than the effective interaction distance $d_{eff}$ of the surface plasmon represented by Equation (4) may be disposed, for example. Furthermore, although the wave vector conversion layer is disposed in contact with the plasmon excitation layer, the present invention is not limited to this example. For example, between the wave vector conversion layer and the plasmon excitation layer, a dielectric layer having a thickness smaller than the effective interaction distance $d_{eff}$ of the surface plasmon represented by Equation (4) may be disposed.

(Embodiment 3)

Figure 8:
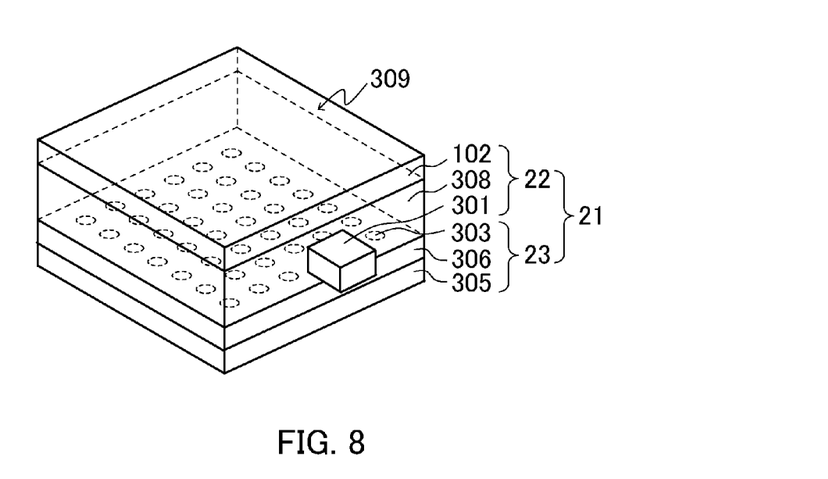
FIG. 8 is a perspective view schematically showing still another example (Embodiment 3) of the structure of the optical device according to the present invention.

An optical device of the present embodiment is an example of the optical device according to the present invention in which the polarization conversion layer is a ¼ wavelength plate and a light guide further is provided. The structure of the optical device of the present embodiment is shown in the perspective view of FIG. 8. In FIG. 8, in order to show all the components, invisible portions hidden by a ¼ wavelength plate 102 and a light guide 308 are indicated with dashed lines. As shown in FIG. 8, the optical device 21 of the present embodiment includes, as main components, a light source section 22 and an optical control section 23. The light source section 22 includes a light-emitting element 301, the ¼ wavelength plate 102, and the light guide 308. The ¼ wavelength plate 102 is stacked on the light guide 308. The light-emitting element 301 is disposed at a peripheral side surface of the light guide 308. The optical control section 23 includes carrier generation sections 303, a plasmon excitation layer 305, and a dielectric layer 306. The dielectric layer 306 is stacked on the plasmon excitation layer 305. The carrier generation sections 303 are embedded periodically in the dielectric layer 306. Each carrier generation section 303 extends through the dielectric layer 306 with one end thereof being in contact with the plasmon excitation layer 305. The carrier generation sections 303 have a function as an "exit layer" in the present invention. The optical control section 23 is stacked on the optical control section 23 with a surface of the light source section 22 on the dielectric layer 306 side facing a surface of the light source section 22 on the light guide 308 side.

Furthermore, in the optical device 21, the distance from the carrier generation section 303-side surface of the plasmon excitation layer 305 to the plasmon excitation layer 305-side surfaces of the carrier generation sections 303 is set to be shorter than the effective interaction distance $d_{\mathit{eff}}$ of the surface plasmon represented by Equation (4).

Next, regarding the optical device 21, an operation in which excitation light from the light-emitting element 301 is incident on the optical control section 23 and light then exits from a surface (light exit surface 309) of the light guide 308 on the side opposite to the carrier generation section 303-side surface of the light guide 308 will be described.

The excitation light emitted from the light-emitting element 301 is incident on the light guide 308, and the light guide 308 guides the excitation light while multiple-reflecting the excitation light between the ¼ wavelength plate 102 and the plasmon excitation layer 305. Among excitation lights being guided, the excitation light incident on the carrier generation sections 303 is absorbed partially by the carrier generation sections 303, whereby carriers are generated in the carrier generation sections 303. The absorptance of excitation light in the carrier generation sections 303 exhibits marked dependency on the polarization state and the incident angle of the excitation light as in Embodiment 1, and the carrier generation sections 303 selectively absorb s-polarized or p-polarized excitation light. The polarization component that has been scarcely absorbed by the carrier generation sections 303 is converted to the polarization state highly absorbable by the carrier generation sections 303 by passing through the ¼ wavelength plate 102 twice. Some of the carriers couple to free electrons in the plasmon excitation layer 305, thereby exciting a surface plasmon at the interface between the dielectric layer 306 and the plasmon excitation layer 305. The excited surface plasmon is diffracted by the periodic structure formed by the carrier generation sections 303 and the dielectric layer 306, and then is radiated to the outside of the optical device 21 as light via the light exit surface 309. The wavelength of the radiated light is equal to the wavelength of light generated when the carrier generation sections 303 are excited independently. The radiation angle $\theta_{rad}$ of the radiated light is represented by Equation (6). In the optical device 21, a light guide 308-side portion of the plasmon excitation layer 305 serves both as an excitation light incident side portion and a light exit side portion as defined in Embodiment 1. The wave number of the surface plasmon excited at the interface between the dielectric layer 306 and the plasmon excitation layer 305 is present only in the vicinity of the value set uniquely by Equation (2). Thus, the radiation angle of the radiated light is determined uniquely, and the polarization state of the radiated light is always p-polarization. That is, the radiated light is p-polarized light having a very high directivity. On the luminous intensity distribution of this radiated light, the luminous intensity distribution of propagation light by carriers that have not coupled to the surface plasmon is superimposed. In the optical device 21, the above-described operation is repeated until, for example, the excitation light is entirely absorbed by the carrier generation sections 303 or is extracted from the light source section 22 to the outside without passing through the optical control section 23.

As the light-emitting element 301, those given as examples of the light-emitting element 101 in Embodiment 1 also are applicable, for example.

Examples of the shape of the light guide 308 include: a rectangular parallelepiped and a wedge shape; and a shape such that a structure for light extraction is provided on a light exit surface 309-side surface of the light guide 308, a surface of the light guide 308 facing the light exit surface 309-side surface, or inside the light guide 308. The structure for light extraction may be provided on each of both the surfaces and the inside of the light guide 308, for example. Surfaces of the light guide 308 excluding the light exit surface 309-side surface and the surface facing the light exit surface 309-side surface preferably are treated using, for example, a reflective material or a dielectric multilayer film or the like so as to prevent the excitation light from exiting from these surfaces.

The carrier generation sections 303 form a layer that absorbs excitation light and in which carriers are generated. The function, forming material, etc. of this layer are the same as those of the carrier generation layer 103 in Embodiment 1, for example.

Examples of the material forming the dielectric layer 306 include high dielectric constant materials such as diamond, $TiO_2$, $CeO_2$, $Ta_2O_5$, $ZrO_2$, $Sb_2O_3$, $HfO_2$, $La_2O_3$, $NdO_3$, $Y_2O_3$, $ZnO$, and $Nb_2O_5$. The thickness of the dielectric layer 306 is not particularly limited, and is, for example, in the range from 1 to 1000 nm, preferably from 5 to 50 nm, and more preferably from 5 to 10 nm By using the high dielectric constant material, it is possible to increase, for example, among carriers generated in the carrier generation sections 303, carriers that couple to the surface plasmon, which allows light having a higher directivity and a higher degree of polarization to be radiated from the optical device 21.

The function, forming material, shape, etc. of the plasmon excitation layer 305 are the same as those of the plasmon excitation layer 105 in Embodiment 1, for example. Between the light guide 308 and the plasmon excitation layer 305, a dielectric layer with optical anisotropy may be disposed, for example. The structure, effect, etc. of this dielectric layer may be the same as those described in Embodiment 1.

In the optical device of the present embodiment shown in FIG. 8, the light source section and the optical control section are stacked so as to be in contact with each other. It is to be noted, however, that the present invention is not limited to this example. For example, the light source section and the optical control section may be disposed apart from each other.

In the optical device of the present embodiment, the ¼ wavelength plate is disposed on the light guide. It is to be noted, however, that the present invention is not limited to this example. Because the excitation light is multiple-reflected, the ¼ wavelength plate may be disposed at any position on the light guide side with respect to the plasmon excitation layer. By disposing the ¼ wavelength plate as described above, the excitation light passes through the ¼ wavelength plate two or more times, so that the above-described effect is obtained. The ¼ wavelength plate may be disposed between the plasmon excitation layer and the dielectric layer or between the dielectric layer and the light guide, for example.

In the optical device of the present embodiment, the carrier generation sections are embedded in the dielectric layer. It is to be noted, however, that the present invention is not limited to this example. For example, the relationship between the dielectric layer and the carrier generation sections may be inverted, and dielectric sections may be embedded periodically in a carrier generation layer. With such a configuration, the same effect as described above also can be obtained. Although the light guide-side surface of the dielectric layer and the light guide-side surface of each carrier generation section are set at the same height, the present invention is not limited to this example, and they are not necessarily be at the same height. For example, the carrier generation sections may be linked together over the entire surface of the dielectric layer, and one end of each carrier generation section is not necessarily be in contact with the plasmon excitation layer.

(Embodiment 4)

An optical device of the present embodiment is an example of the optical device according to the present invention that further includes a ½ wavelength plate as the polarization converter. The structure of the optical device of the present embodiment is shown in the schematic view of FIG. 11.

Figure 11:
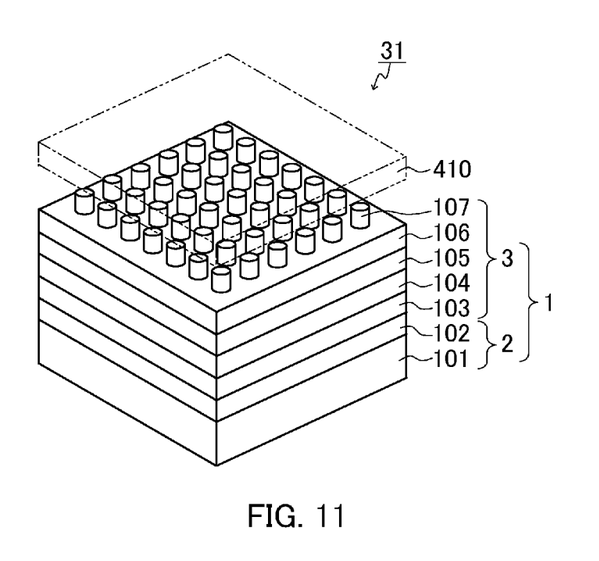
FIG. 11 is a perspective view schematically showing yet another example (Embodiment 4) of the structure of the optical device according to the present invention.

As shown in FIG. 11, the optical device 31 of the present embodiment includes, as main components, an optical device 1 and a ½ wavelength plate 410. The optical device 1 is the optical device of Embodiment 1 shown in FIG. 1. The ½ wavelength plate 410 is disposed on the wave vector conversion layer 107-side of the optical device 1. In FIG. 11, for the sake of convenience in illustration, the ½ wavelength plate 410 is indicated with chain double-dashed lines.

As shown in Embodiment 1, light exits from a wave vector conversion layer 107. Because the light is p-polarized light as described above, the light exhibits a field pattern with a radial polarization direction. Thus, the light is axially symmetric polarized light (see the paragraph [0104] in WO 2011/040528 A1, for example). Then, the light (axially symmetric polarized light) is incident on the ½ wavelength plate 410. At this time, the axially symmetric polarized light is converted to linearly polarized light by the ½ wavelength plate 410. In this manner, in the optical device of the present embodiment, it is possible to align the polarization state of the light (see the paragraph [0105] in WO 2011/040528 A1, for example).

The ½ wavelength plate 410 is not particularly limited, and may be a conventionally known ½ wavelength plate, for example. Specific examples thereof include the following ½ wavelength plate disclosed in WO 2011/040528 A1.

The ½ wavelength plate disclosed in WO 2011/040528 A1 is, for example, a ½ wavelength plate that includes: a pair of glass substrates each having an alignment film formed thereon; a liquid crystal layer sandwiched between the glass substrates disposed so that the alignment films face each other; and a spacer disposed between the glass substrates. In the liquid crystal layer, a refractive index $n_e$ is larger than a refractive index $n_0$, where $n_0$ is a refractive index to ordinary light and $n_e$ is a refractive index to extraordinary light. The thickness d of the liquid crystal layer satisfies $(n_e-n_0) \times d = \lambda/2$, where $\lambda$ is a wavelength of incident light in a vacuum.

In the liquid crystal layer, liquid crystal molecules are arranged concentrically about the center of the ½ wavelength plate. The liquid crystal molecules are aligned in a direction satisfying the relationship expressed by either $\theta=2\phi$ or $\theta=2\phi-180$, where $\phi$ is an angle formed between the main axis of the liquid crystal molecules and the coordinate axis in the vicinity of the main axis, and $\theta$ is an angle formed between the coordinate axis and the polarization direction.

In the optical device of the present embodiment shown in FIG. 11, axially symmetric polarized light is converted to linearly polarized light by the ½ wavelength plate. It is to be noted, however, that the present invention is not limited to this example. For example, the axially symmetric polarized light may be converted to circularly polarized light. Furthermore, although the optical device of Embodiment 1 is used in the optical device of the present embodiment, the present invention is not limited to this example. For example, the optical device of Embodiment 2 or 3 also may be used.

(Embodiment 5)

An optical element of the present embodiment includes: a carrier generation layer on which light from a light-emitting element is incident and in which carriers are generated; a plasmon excitation layer that excites a plasmon, which is stacked on an upper side of the carrier generation layer and has a plasma frequency higher than a frequency of light generated when the carrier generation layer is excited by the light from the light-emitting element; and an exit layer that converts light or a surface plasmon generated on a surface of the plasmon excitation layer into light having a predetermined exit angle and from which the light having the predetermined exit angle exits, and the optical element further includes a polarization conversion layer on the lower side of the carrier generation layer. The polarization conversion layer preferably is a ¼ wavelength plate. Regarding the structures of the respective components, improvement of the absorptance of excitation light, and the like in the present embodiment, the descriptions in Embodiment 1 etc. can be referenced.

(Embodiment 6)

Figure 9A:
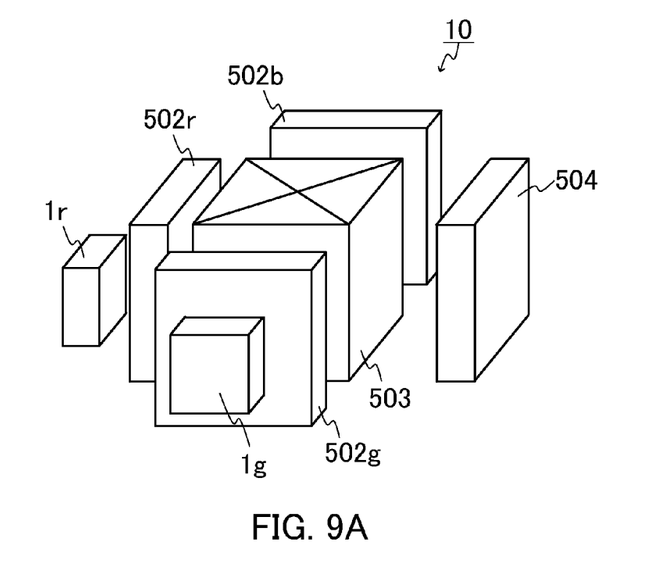
FIGS. 9A and 9B are schematic views showing an example (Embodiment 6) of the structure of the image display device (LED projector) according to the present invention.

An image display device of the present embodiment is an example of a three-plate type projection display device (LED projector). The structure of the LED projector of the present embodiment is shown in FIG. 9. FIG. 9A is a schematic perspective view showing the LED projector of the present embodiment, and FIG. 9B is a top view of the same.

Figure 9B:
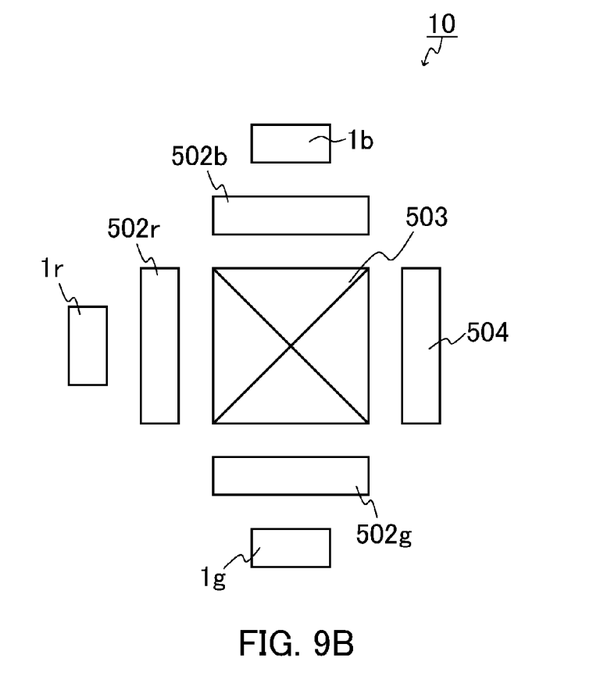

As shown in FIG. 9, the LED projector 10 of the present embodiment includes, as main components: three optical devices 1r, 1g, and 1b, which are the optical devices of any of Embodiments 1 to 4; three liquid crystal panels 502r, 502g, and 502b: a color synthesis optical element 503; and a projection optical system 504. The optical device 1r and the liquid crystal panel 502r; the optical device 1g and the liquid crystal panel 502g; and the optical device 1b and the liquid crystal panel 502b form optical paths, respectively.

The optical device 1r is for red (R) light, the optical device 1g is for green (G) light, and the optical device 1b is for blue (B) light, and they are formed of different materials. The liquid crystal panels 502r, 502g, and 502b modulate light intensity in accordance with an image to be displayed. The color synthesis optical element 503 combines lights that have passed through the liquid crystal panels 502r, 502g, and 502b. The projection optical system 504 includes a projection lens that projects light exiting from the color synthesis optical element 503 on a projection surface such as a screen.

Figure 10:
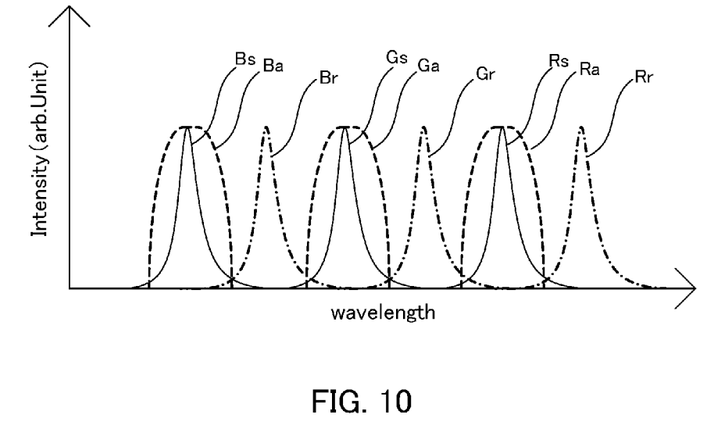
FIG. 10 illustrates emission wavelengths of an optical device used in the LED projector of Embodiment 6 and excitation wavelengths and emission wavelengths of a fluorescent material.

FIG. 10 shows the relationship of emission wavelengths (Rs, Gs, Bs) of the optical devices used in the LED projector 10 with the intensities of the excitation wavelengths (Ra, Ga, Ba) and emission wavelengths (Rr, Gr, Br) of the carrier generation layer. As shown in FIG. 10, emission wavelengths Rs, Gs, and Bs of the optical device for R light, the optical device for G light, and the optical device for B light are set so as to be subsequently equal to the excitation wavelengths Ra, Ga, and Ba of the carrier generation layer, respectively. The emission wavelengths Rs, Gs, and Bs of the optical devices and the excitation wavelengths Ra, Ga, and Ba of the carrier generation layer are set so as not to overlap with the emission wavelengths Rr, Gr, and Br of the carrier generation layer, respectively. Emission spectra of the optical device for R light, the optical device for G light, and the optical device for B light are set so as to match or to be within the corresponding excitation spectra of the carrier generation layer, respectively. Also, the emission spectra of the carrier generation layer are set so as to scarcely overlap with any of the excitation spectra of the carrier generation layer.

The LED projector 10 modulates an image on the liquid crystal panel by controlling each optical path with a control circuit section (not shown). By including the optical devices of any of Embodiments 1 to 4, the LED projector 10 can improve the luminance of projected images. Furthermore, because these optical devices each exhibit a very high directivity, it is possible to downsize the LED projector 10 without using an illumination optical system, for example.

Although the LED projector of the present embodiment shown in FIG. 9 is a three-plate type liquid crystal projector, the present invention is not limited to this example. For example, the LED projector may be a single plate-type liquid crystal projector or the like. Also, the image display device according to the present invention is not limited to the above-described LED projector, and may be, for example, a projector that uses a light-emitting element other than LED (e.g., a laser diode, a super luminescent diode, or the like), or may be an image display device combined with a backlight of a liquid crystal display or with a backlight using MEMS. Also, the image display device according to the present invention may be configured so that, for example, only the optical element according to the present invention, such as the optical element of Embodiment 5, is included therein and the light-emitting element is provided outside of the image display device.

As described above, the optical device and the optical element according to the present invention can achieve an improved absorption efficiency of excitation light. Therefore, an image display device that uses the optical device or the optical element according to the present invention can be used as a projector and the like. Examples of the projector include mobile projectors, next-generation rear projection TVs, digital cinemas, retinal scanning displays (RSDS), head up displays (HUDs), and embedded projectors for use in mobile phones, digital cameras, and notebook computers, and thus, the projector is widely applicable to various markets. It is to be noted, however, that the use of the optical device and the optical element according to the present invention is not limited by any means, and they are applicable to a broad range of fields.

While the present invention has been described above with reference to the illustrative embodiments, the present invention is by no means limited to these embodiments. Various changes and modifications that may become apparent to those skilled in the art may be made in the configuration and specifics of the present invention without departing from the scope of the present invention.

This application claims priority from Japanese Patent Application No. 2012-1692 filed on Jan. 7, 2012. The entire disclosure of this Japanese patent application is incorporated herein by reference.

EXPLANATION OF REFERENCE NUMERALS 1, 1r, 1g, 1b, 11, 21, 31: optical device
2, 22: light source section
3, 13, 23: optical control section
10: LED projector (image display device)
101, 301: light-emitting element
102: ¼ wavelength plate (polarization conversion layer)
103: carrier generation layer
104: dielectric layer
105, 305: plasmon excitation layer
106, 306: dielectric layer
107, 207: wave vector conversion layer (exit layer)
303: carrier generation section (exit layer)
308: light guide
309: light exit surface
410: ½ wavelength plate (polarization converter)
502r, 502g, 502b: liquid crystal panel
503: color synthesis optical element
504: projection optical system

The invention claimed is:

1. An optical device comprising:
  a light-emitting element;
  a carrier generation layer on which light from the light-emitting element is incident and in which carriers are generated;
  a plasmon excitation layer that excites a plasmon, the plasmon excitation layer being stacked on an upper side of the carrier generation layer and having a plasma frequency higher than a frequency of light generated when the carrier generation layer is excited by the light from the light-emitting element; and
  an exit layer that converts light or a surface plasmon generated on a surface of the plasmon excitation layer into light having a predetermined exit angle and from which the light having the predetermined exit angle exits,
  wherein the optical device further comprises a polarization conversion layer on a lower side of the carrier generation layer.

2. The optical device according to claim 1, wherein the polarization conversion layer is a ¼ wavelength plate.

3. The optical device according to claim 1, wherein a dielectric layer is stacked on at least one surface of the plasmon excitation layer.

4. The optical device according to claim 1, wherein the distance between a carrier generation layer side-surface of the plasmon excitation layer and a plasmon excitation layer side-surface of the carrier generation layer is shorter than an effective interaction distance of a surface plasmon excited on the carrier generation layer side-surface of the plasmon excitation layer.

5. The optical device according to claim 4, wherein the carrier generation layer is disposed within a distance in the range from 1 to 200 nm from the plasmon excitation layer.

6. The optical device according to claim 1, wherein the exit layer has a surface periodic structure.

7. The optical device according to claim 6, wherein the surface periodic structure is a photonic crystal structure.

8. The optical device according to claim 1, wherein the carrier generation layer has a surface periodic structure and serves also as the exit layer.

9. The optical device according to claim 1, further comprising a polarization converter that sets axially symmetric polarized light exiting from the exit layer in a predetermined polarization state.

10. The optical device according to claim 1, wherein an incident side portion that comprises an entire structure provided on the light-emitting element side of the plasmon excitation layer and a medium in contact with the light-emitting element has a lower effective dielectric constant than an exit side portion that comprises an entire structure provided on the exit layer side of the plasmon excitation layer and a medium in contact with the exit layer.

11. The optical device according to claim 1, wherein an incident side portion that comprises an entire structure provided on the light-emitting element side of the plasmon excitation layer and a medium in contact with the light-emitting element has an effective dielectric constant higher than or equal to an effective dielectric constant of an exit side portion that comprises an entire structure provided on the exit layer side of the plasmon excitation layer and a medium in contact with the exit layer, and
  an end of the exit layer on the plasmon excitation layer side is disposed so that a distance between the end and an exit layer side-surface of the plasmon excitation layer is within an effective interaction distance of the surface plasmon.

12. The optical device according to claim 10, wherein the effective dielectric constant ($\varepsilon_{eff}$) is represented by either one of the following Equation (1) and Equation (7):

$$\varepsilon_{\mathit{eff}} = \left( \frac{\iiint_D \mathrm{Re}\left[ \sqrt{\varepsilon(\omega, x, y, z)} \right] \exp(2jk_{spp,z}z)}{\iiint_D \exp(2jk_{spp,z}z)} \right)^2 \qquad (1)$$

$$\varepsilon_{\mathit{eff}} = \frac{\iiint_D \mathrm{Re}\left[ \sqrt{\varepsilon(\omega, x, y, z)} \right] \exp(2jk_{spp,z}z)}{\iiint_D \exp(2jk_{spp,z}z)} \qquad (7)$$

where an x axis and a y axis are directions parallel to an interface of the plasmon excitation layer; a z axis is a direction perpendicular to the interface of the plasmon excitation layer; ω is an angular frequency of light exiting from the carrier generation layer; $\in(\omega, x, y, z)$ is a dielectric constant distribution of dielectric substances in the incident side portion or the exit side portion; an integration range D is a range of three-dimensional coordinates in the incident side portion or the exit side portion; $k_{spp,z}$ is a z component of a wave number of a surface plasmon; j is an imaginary unit; and Re[ ] is a sign indicating a real part of a numerical value in the square brackets, and the z component $k_{spp,z}$ of the wave number of the surface plasmon and an x and y components $k_{spp}$ of the wave number of the surface plasmon are represented by the following Equation (2) and Equation (3), respectively:

$$k_{spp,z} = \sqrt{\varepsilon_{\mathit{eff}} k_0^2 - k_{spp}^2} \qquad (2)$$

$$k_{spp} = k_0 \mathrm{Re}\left[ \sqrt{\frac{\varepsilon_{\mathit{eff}} \varepsilon_{metal}}{\varepsilon_{\mathit{eff}} + \varepsilon_{metal}}} \right] \qquad (3)$$

where $\in_{metal}$ is a real part of a dielectric constant of the plasmon excitation layer; and $k_0$ is a wave number of light in a vacuum.

13. The optical device according to claim 4, wherein the effective interaction distance $d_{\mathit{eff}}$ is represented by the following Equation (4):

$$d_{\mathit{eff}} = \mathrm{Im}\left[ \frac{1}{k_{spp,z}} \right] \qquad (4)$$

where Im[ ] is a sign indicating an imaginary part of a numerical value in the square brackets.

14. The optical device according to claim 1, wherein an incident angle of the light incident on the carrier generation layer is set to 40° or more.

15. An optical element comprising:
a carrier generation layer on which light from a light-emitting element is incident and in which carriers are generated;
a plasmon excitation layer that excites a plasmon, the plasmon excitation layer being stacked on an upper side of the carrier generation layer and having a plasma frequency higher than a frequency of light generated when the carrier generation layer is excited by the light; and
an exit layer that converts light or a surface plasmon generated on a surface of the plasmon excitation layer into light having a predetermined exit angle and from which the light having the predetermined exit angle exits,
wherein the optical element further comprises a polarization conversion layer on a lower side of the carrier generation layer.

16. The optical element according to claim 15, wherein the polarization conversion layer is a ¼ wavelength plate.

17. An image display device comprising:
the optical device according to claim 1; and
an image display section that can display an image.

18. The image display device according to claim 17, further comprising a projection optical system that projects a projection image using light exiting from the image display section.

19. The optical device according to claim 2, wherein a dielectric layer is stacked on at least one surface of the plasmon excitation layer.

20. The optical device according to claim 2, wherein the distance between a carrier generation layer side-surface of the plasmon excitation layer and a plasmon excitation layer side-surface of the carrier generation layer is shorter than an effective interaction distance of a surface plasmon excited on the carrier generation layer side-surface of the plasmon excitation layer.

* * * * *